United States Patent
Ullal et al.

(10) Patent No.: US 9,966,350 B2
(45) Date of Patent: May 8, 2018

(54) WAFER-LEVEL PACKAGE DEVICE

(75) Inventors: Vijay Ullal, Saratoga, CA (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 656 days.

(21) Appl. No.: 13/154,061

(22) Filed: Jun. 6, 2011

(65) Prior Publication Data

US 2012/0306071 A1    Dec. 6, 2012

(51) Int. Cl.
*H01L 23/48*    (2006.01)
*H01L 23/00*    (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 2224/0401* (2013.01); *H01L 2224/0508* (2013.01); *H01L 2224/05124* (2013.01); *H01L 2224/05147* (2013.01); *H01L 2224/05155* (2013.01); *H01L 2224/05572* (2013.01); *H01L 2224/05624* (2013.01); *H01L 2224/05647* (2013.01); *H01L 2224/05655* (2013.01); *H01L 2224/10125* (2013.01); *H01L 2224/10145* (2013.01); *H01L 2224/11005* (2013.01); *H01L 2224/11849* (2013.01); *H01L 2224/131* (2013.01); *H01L 2224/13005* (2013.01); *H01L 2224/136* (2013.01); *H01L 2224/1319* (2013.01); *H01L 2224/13111* (2013.01);

(Continued)

(58) Field of Classification Search
CPC ....... H01L 2924/00; H01L 2224/48227; H01L 2224/73265; H01L 2224/32225; H01L 2924/00012; H01L 2924/15311; H01L 2924/00014; H01L 2224/48091; H01L 2224/48465; H01L 2224/97; H01L 2924/01082

USPC ......... 257/E23.141, 738, 780, 737, E25.013, 257/686, 778, E25.023; 438/107, 126, 438/112, 122, 123, 124, 125, 118, 613

See application file for complete search history.

(56) References Cited

U.S. PATENT DOCUMENTS 6,002,168 A * 12/1999 Bellaar et al. ................ 257/696
6,208,025 B1 * 3/2001 Bellaar et al. ................ 257/696

(Continued)

FOREIGN PATENT DOCUMENTS

CN    101958261 A    1/2011
CN    102034779 A    4/2011

OTHER PUBLICATIONS

Office Action dated Feb. 3, 2016 for CN Application No. 201210184230.9.

*Primary Examiner* — William F Kraig
*Assistant Examiner* — Edward Chin
(74) *Attorney, Agent, or Firm* — Advent, LLP

(57) ABSTRACT

Wafer-level package semiconductor devices are described that have a smallest distance between two adjacent attachment bumps smaller than about twenty-five percent (25%) of a pitch between the two adjacent attachment bumps. The smallest distance between the two adjacent attachment bumps allows for an increase in the number of attachment bumps per area without reducing the size of the bumps, which increases solder reliability. The increased solder reliability may reduce stress to the attachment bumps, particularly stress caused by CTE mismatch during thermal cycling tests, dynamic deformation during drop tests or cyclic bending tests, and so on.

1 Claim, 4 Drawing Sheets

(52) U.S. Cl.
CPC ........... *H01L 2224/13561* (2013.01); *H01L 2224/13562* (2013.01); *H01L 2224/13582* (2013.01); *H01L 2224/13647* (2013.01); *H01L 2224/13655* (2013.01); *H01L 2224/94* (2013.01); *H01L 2924/00014* (2013.01); *H01L 2924/014* (2013.01); *H01L 2924/01006* (2013.01); *H01L 2924/01013* (2013.01); *H01L 2924/01023* (2013.01); *H01L 2924/01029* (2013.01); *H01L 2924/01033* (2013.01); *H01L 2924/01047* (2013.01); *H01L 2924/01082* (2013.01); *H01L 2924/01327* (2013.01); *H01L 2924/12042* (2013.01); *H01L 2924/381* (2013.01)

(56) References Cited

U.S. PATENT DOCUMENTS

| | | | |
|---|---|---|---|
| 6,337,445 B1 * | 1/2002 | Abbott et al. | 174/260 |
| 6,583,516 B2 * | 6/2003 | Hashimoto | 257/781 |
| 6,972,249 B2 * | 12/2005 | Akram et al. | 438/613 |
| 7,208,842 B2 * | 4/2007 | Jeong | 257/781 |
| 7,230,334 B2 * | 6/2007 | Andry et al. | 257/713 |
| 7,654,432 B2 * | 2/2010 | MacKay et al. | 228/39 |
| 7,755,200 B2 * | 7/2010 | Nguyen | 257/773 |
| 7,859,119 B1 * | 12/2010 | St. Amand et al. | 257/777 |
| 8,039,761 B2 * | 10/2011 | Choi et al. | 174/263 |
| 8,093,722 B2 * | 1/2012 | Chen et al. | 257/738 |
| 8,115,302 B2 * | 2/2012 | Andry et al. | 257/713 |
| 8,183,696 B2 * | 5/2012 | Meyer et al. | 257/774 |
| 8,232,655 B2 * | 7/2012 | Arvin et al. | 257/781 |
| 8,310,051 B2 * | 11/2012 | Chen et al. | 257/738 |
| 2001/0048158 A1 * | 12/2001 | Lin | 257/737 |
| 2006/0261499 A1 * | 11/2006 | Chen et al. | 257/787 |
| 2009/0108443 A1 * | 4/2009 | Jiang | 257/737 |
| 2009/0256256 A1 * | 10/2009 | Meyer | 257/738 |
| 2009/0315179 A1 * | 12/2009 | Shigihara et al. | 257/737 |
| 2010/0109160 A1 * | 5/2010 | Sakaguchi et al. | 257/737 |
| 2012/0098120 A1 * | 4/2012 | Yu et al. | 257/737 |
| 2012/0208319 A1 * | 8/2012 | Meyer et al. | 438/107 |

* cited by examiner

WAFER-LEVEL PACKAGE DEVICE

BACKGROUND

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Techniques are described for fabricating wafer-level package semiconductor devices that have a smallest distance between two adjacent attachment bumps (e.g., solder bumps), which is smaller than about twenty-five percent (25%) of a pitch between the two adjacent attachment bumps. The reduced distance between the two adjacent attachment bumps allows for an increase in the number of attachment bumps per unit area without reduction in the size of the bumps, thereby increasing solder reliability. The increased solder reliability may reduce stress to the attachment bumps, particularly stress caused by CTE mismatch during thermal cycling tests, dynamic deformation during drop tests or cyclic bending tests, and so on.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
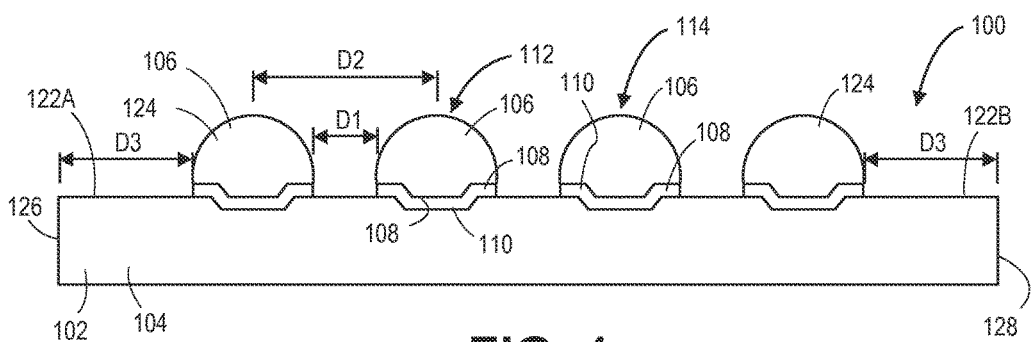
FIG. 1 is a diagrammatic partial cross-sectional side elevation view illustrating a wafer-level package device in accordance with an example implementation of the present disclosure.

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with dies having a die size of less than about 5.5×5.5 mm$^2$). For devices employing larger chips (e.g., having a die size between 5.5×5.5 mm$^2$ and 7.0×7.0 mm$^2$), the mismatch of the coefficient of thermal expansion (CTE) between the chip and the printed circuit board (FR4) to which the device is mounted becomes significant. During thermal cycling tests, this mismatch can cause high stress and cracks in solder bumps used to mount the device to the printed circuit board. Moreover, during drop tests and cyclic bending tests, the relatively high stiffness of solder may cause stress to occur at the interface between the solder bumps and the intermetallic compounds of the bumps due to dynamic deformation.

Accordingly, techniques are described for fabricating wafer-level package semiconductor devices having a smallest distance between two adjacent attachment bumps (e.g., solder bumps) smaller than about twenty-five percent (25%) of the pitch between the two adjacent attachment bumps (e.g., distance between the centers of two adjacent bumps). This increases the solder reliability due to an increase in the number of attachment bumps per unit area of the device. The increased solder reliability reduces stress to the devices, particularly stresses caused by CTE mismatch (e.g., the mismatch of mechanical and thermal properties between the device and a printed circuit board the device is mounted to), dynamic deformation during drop tests or cyclic bending tests, and so on. The techniques thus facilitate the fabrication of wafer-level package devices that employ large integrated circuit chips (e.g., devices that employ dies having a die size of greater than about 5.5×5.5 mm$^2$). Such wafer-level package devices may be employed in a variety of applications including, but not limited to: system on chip (SOC) applications, dynamic random access memory (DRAM) applications, and central processing unit (CPU) applications.

In implementations, the wafer-level package (WLP) devices may also include one or more dividers disposed between adjacent attachment bumps to prevent migration of solder during reflow processes, and to provide mechanical robustness when the devices are connected to printed circuit boards. In one or more implementations, the dividers may be formed of a dielectric material, such as a benzocyclobutene (BCB) polymer, and so forth. The devices may further include overhang portions that are greater in width than the pitch of the device.

Example Implementations

FIGS. 1 through 4 illustrate wafer-level package (WLP) devices 100 in accordance with example implementations of the present disclosure. As shown, the wafer-level package devices 100 include an integrated circuit chip 102 that comprise a substrate 104 that includes attachment bumps 106. The substrate 104 is fabricated from a wafer, such as a silicon wafer (e.g., p-type wafer, n-type wafer, or the like), that includes one or more integrated circuits (not shown) formed therein. The integrated circuits may be formed from suitable semiconductor formation techniques, such as deposition, etching, annealing, photolithography, and so forth. Once formed, the integrated circuits are configured to provide functionality to the devices 100. The integrated circuits may be configured in a variety of ways. For example, the integrated circuits may be comprised of digital circuit technology, analog circuit technology, mixed-signal technology, and so forth. The integrated circuits may be connected to one or more conductive layers, such as contact pads, or the like, deployed over the integrated circuit chip 102 (e.g., substrate 104). These conductive layers provide electrical contacts through which the integrated circuits are interconnected to other components associated with the device 100 (e.g., printed circuit boards, etc.). The number and configuration of conductive layers (e.g., contact pads) may vary depending on the complexity and configuration of the integrated circuits, the size and shape of the integrated circuit chip 102, and so forth. The substrate 104 may further include one or more protective layers (e.g., passivation layers, dielectric layers, etc.) formed over the integrated circuits to furnish protection to the integrated circuits during manufacturing and use. The protective layers may comprise various materials, such as benzocyclobutene polymer (BCB), silicon dioxide ($SiO_2$), and so forth.

As illustrated in FIGS. 1 thorough 4, the attachment bumps 106 comprise solder bumps that furnish mechanical and/or electrical interconnection between the contact pads deployed over the integrated circuit chip 102 and corresponding pads (not shown) formed on the surface of a printed circuit board. In one or more implementations, the attachment bumps 106 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. Example processes for forming the attachment bumps 106 using wafer-level packaging techniques are described in more detail below.

Bump interfaces 108 may be applied to the contact pads of the integrated circuit chip 102 to provide a reliable interconnect boundary between the contact pads and the attachment bumps 106. For instance, in the wafer-level package device 100 shown in FIGS. 1 through 4, the bump interface 108 comprise under-bump metallization (UBM) 110 applied to the contact pads of the integrated circuit chip 102. The UBM 110 may have a variety of compositions. For example, the UBM 110 may include multiple layers of different metals (e.g., Aluminum (Al), Nickel (Ni), Copper (Cu), vanadium, etc.) that function as an adhesion layer, a diffusion barrier layer, a solderable layer, an oxidation barrier layer, and so forth. However, other UBM structures are possible.

Viewed together, the attachment bumps 106 and associated bump interfaces 108 (e.g., UBM 110) comprise bump assemblies 112 that are configured to provide mechanical and/or electrical interconnection of the integrated circuit chip 102 to the printed circuit board. As illustrated in FIGS. 1 through 4, the wafer-level package devices 100 may include one or more arrays 114 of bump assemblies 112 depending on various design considerations.

Figure 2:
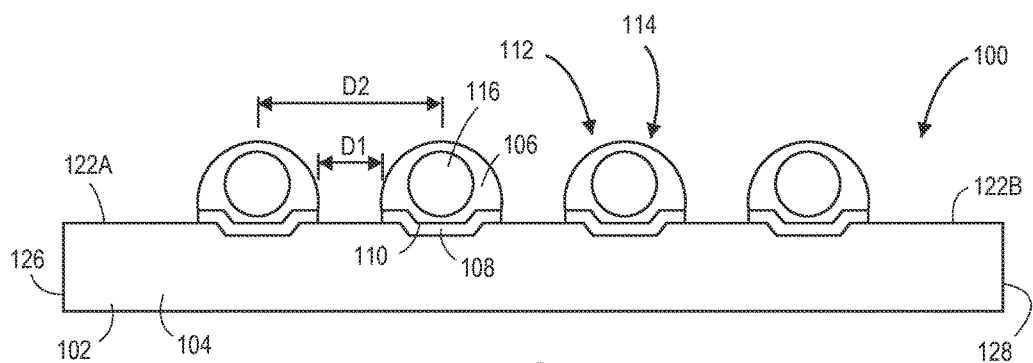
FIG. 2 is a diagrammatic partial cross-sectional side elevation views illustrating a wafer-level package device in accordance with another example implementation of the present disclosure, wherein the attachment bumps include a core.
Figure 3:
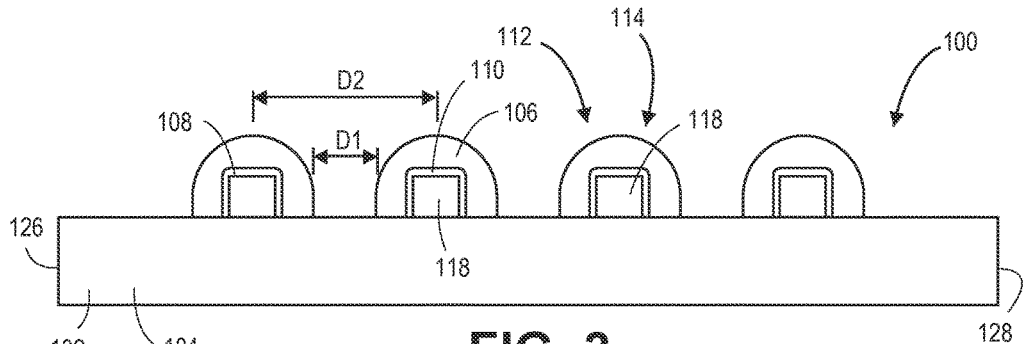
FIG. 3 is a diagrammatic partial cross-sectional side elevation views illustrating a wafer-level package device in accordance with another example implementation of the present disclosure, wherein the attachment bumps are formed about a post structure.

As illustrated in FIGS. 1 through 3, the bump assemblies 112 may be configured in a variety of ways. In an implementation, as illustrated in FIG. 1, the attachment bumps 106 may comprise solder.

In another implementation, as illustrated in FIG. 2, the attachment bumps 106 may include a core 116 surrounded by solder. The core 116 may be formed of various materials, such as a polymer, or the like. In one or more implementations, the core's 116 outer surface may be coated with a metal layer (e.g., nickel or copper) to allow the solder of bump 106 to bond to the core 116 during the reflow process. The core 116 serves to lower thermo-mechanical stresses, which eliminate the need for underfill processes, and increases the mechanical stability of the device 100 at temperatures over two hundred degree Celsius (200° C.). Moreover, the core 116 allows for a defined attachment bump 106 height after reflow.

As illustrated in FIG. 3, the attachment bumps 106 may also be formed about a post structure 118. In implementations, the post structure 118 may be fabricated from one or more dielectric materials, such as benzocyclobutene polymer (BCB), polyimide (PI), polybenz-oxazole (PBO), or the like. Like the core 116 structure described above, the post structure 118 is configured to increase the mechanical stability of the device 100 at temperatures over two hundred degrees Celsius (200 C) and also allows for defined attachment bump 106 height after reflow.

Figure 4:
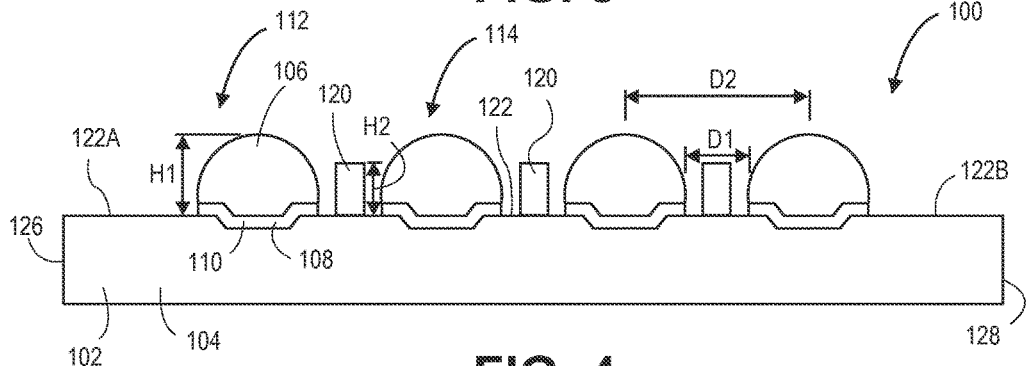
FIG. 4 is a diagrammatic partial cross-sectional side elevation views illustrating a wafer-level package device in accordance with another example implementation of the present disclosure, wherein dividers are formed between adjacent attachment bumps.

As illustrated in FIG. 4, the device 100 may further include dividers 120 that are formed over a surface 122 of the device 100. These dividers 120 may be configured in a variety of ways. For example, the dividers 120 may be formed of a dielectric material, such as BCB. In one or more implementations, a dielectric material may be deposited over the device 100 and selectively etched to form the dividers 120. The dividers 120 serve to prevent the solder from migrating to neighboring (e.g., adjacent) attachment bumps 106 and shorting the device 100. The dividers 120 may also serve to provide mechanical support to the device 100. In one or more implementations, the height ($H_1$) of the attachment bumps 106 (after reflow) is greater than the height ($H_2$) of the dividers 120 so that the attachment bumps 106 may connect to corresponding PCB pads. However, the dividers 120 may also be removed prior to wafer-level packaging via one or more removal techniques. For example, the dividers 120 may be removed via a chemical etch after the reflow process. It is contemplated that the implementation of device 100 shown in FIG. 4 may be fabricated utilizing attachment bumps 106 having a core 116 (as shown in FIG. 2). It is further contemplated that the implementation of device 100 shown in FIG. 4 may be fabricated utilizing attachment bumps 106 formed about one or more post structures 118 (as shown in FIG. 3).

As illustrated in FIGS. 1 through 4, the devices 100 employ a Bump-On-Pad ("BOP") configuration where the contact pad is directly in contact with the bump interfaces 108 (e.g., UBM pads). However, it is contemplated that the devices 100 may also employ a Redistribution Layer ("RDL") configuration. An RDL configuration includes a redistribution structure comprised of a thin-film metal (e.g., aluminum, copper) rerouting and interconnection system that redistributes the contact pads to an area array of bump interfaces 108 (e.g., UBM pads) that may be more evenly deployed over the device 100. The attachment bumps 106 are subsequently placed over these bump interfaces 108 to form bump assemblies 112.

In accordance with the present disclosure, a smallest distance ($D_1$) between two adjacent attachment bumps 106 included in the array 114 of bump assemblies 112 is smaller than about twenty-five (25) percent of a pitch distance ($D_2$) between the same two adjacent attachment bumps. For example, if the pitch (e.g., pitch distance) between two adjacent attachment bumps 106 is 0.4 millimeters (mm), the smallest distance between the two adjacent attachment bumps 106 is about 0.1 mm or smaller. In another example, if the pitch between the two adjacent attachment bumps 106 is 0.35 mm, the smallest distance between the two adjacent attachment bumps 106 is about 0.0875 mm. In these implementations, the attachment bump 106 size may be about two hundred and fifty (250) microns in diameter (before attachment bump 106 reflow). However, other attachment bump sizes may be utilized depending on the design requirements of the wafer-level device 100. For example, the attachment bump 106 size may be less than two hundred and fifty (250) microns in diameter in some implementations and greater than two hundred and fifty (250) microns in diameters in other implementations.

Typical WLP devices with solder bumps of two hundred and fifty (250) microns in diameter have a pitch of 0.4 mm. However, as described above, the pitch of device 100 may be reduced to about 0.35 mm while still having solder bumps (e.g., attachment bumps 106) of about two hundred and fifty (250) microns in diameter. This pitch reduction helps to mitigate solder fatigue that occurs due to coefficient of thermal expansion (CTE) mismatches during thermal cycling tests, and so forth. Moreover, the pitch reduction may increase the number of attachment bumps 106 per area without reducing the size of the bumps 106, which enhances solder reliability. It is contemplated that the parameters of the device 100 fabrication as well as the corresponding PCB pad dimensions should be chosen appropriately to prevent merging (e.g., shorting) of solder at adjacent sites.

In another implementation, as illustrated in FIG. 1, the devices 100 may include overhang portions 122A, 122B that extend beyond the outermost bump assemblies 124. The overhang portions 122A, 122B provide further mechanical support and solder reliability to the WLP device 100. The overhang portions 122A, 122B are configured to extend a distance (D3) that is greater than the pitch distance (D2) of the device 100. Typically, overhang portions only extend to about the pitch distance without the need for a dummy row of solder bumps (e.g., solder bumps without an associated electrical interconnection). Thus, the device 100 may only include a minimum array 114 of bump assemblies 112 dictated by the input/output requirements and the pitch distance (D2). It is contemplated that the overhang portions 122A, 122B are a function of the array 114 size. It is contemplated that the array 114 may be arranged in M×N arrays (where M>1 and N>1). In an implementation, a 10×10 array with a 0.35 mm pitch may allow for the overhang portions 122A, 122B to each extend out 0.7 mm. In another implementation, a 16×16 array with a 0.35 mm pitch may allow for the overhang portions 122A, 122B to each extend out 1.1 mm. However, it is contemplated that other array configurations may be utilized and the dimensions of the overhang portions 122A, 122B will vary depending on these array configurations and the requirements of the device 100 (e.g., the size of the attachment bumps 106, the pitch, etc.).

It is further contemplated that the devices 100 shown in FIGS. 1 through 4 may be designed and fabricated without overhang portions 122A, 122B. Thus, in an implementation, the edges 126, 128 of the devices 100 may extend a distance approximately equal to the pitch (D2). In another implementation, the edges 126, 128 may extend a distance that is less than the pitch (D2).

Example Fabrication Processes

Figure 5:
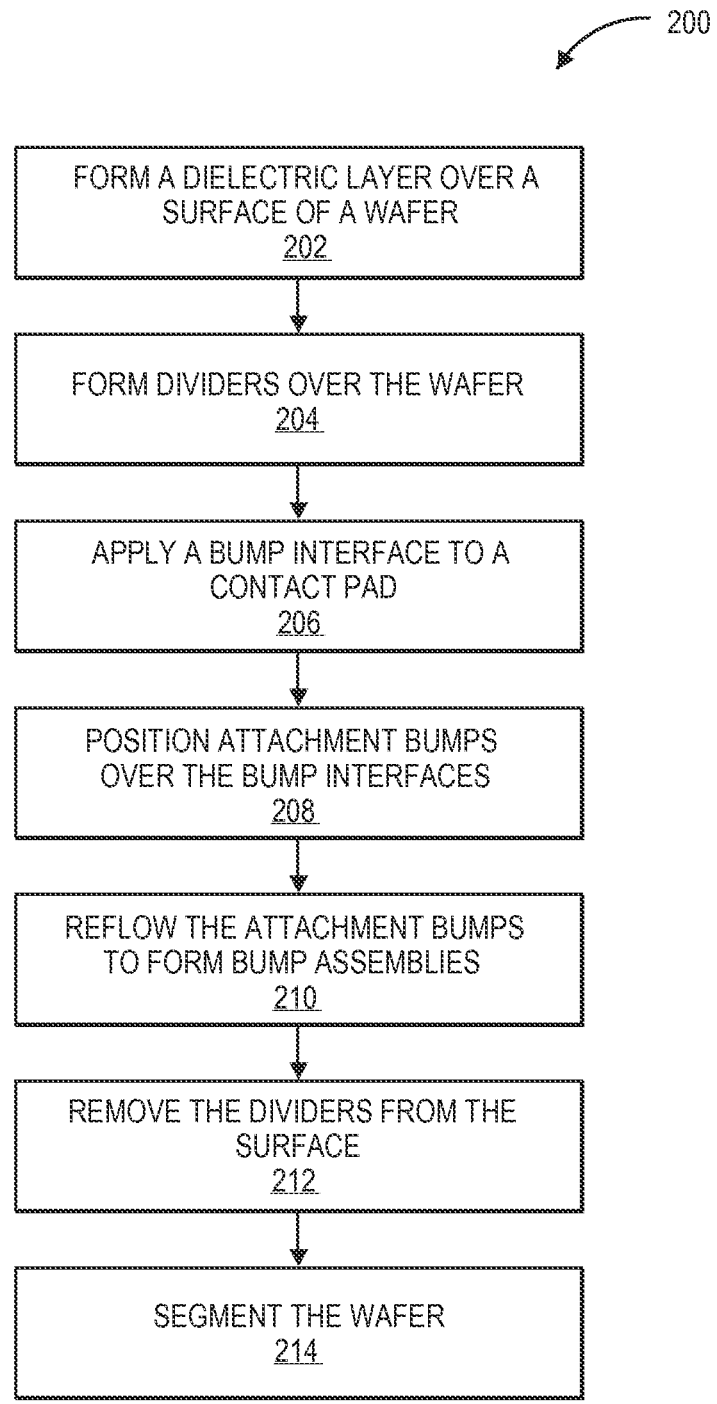
FIG. 5 is a flow diagram illustrating a process in an example implementation for fabricating flexible wafer-level package devices, such as the device shown in FIG. 1.
Figure 6:
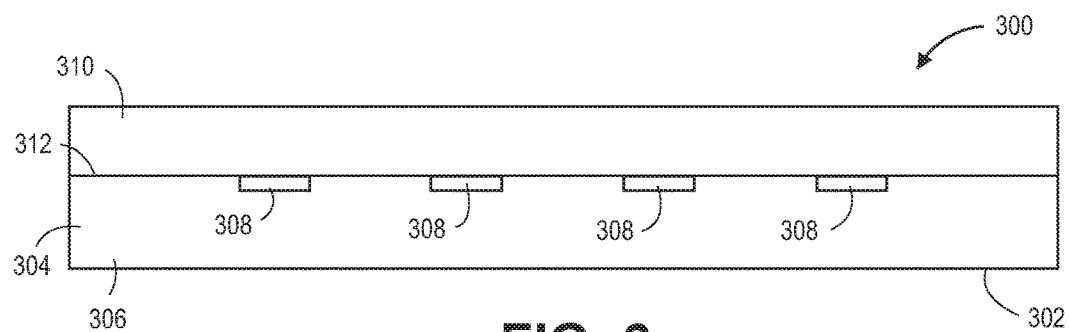
FIG. 6 through 11 are diagrammatic partial cross-sectional side elevation views illustrating the fabrication of a flexible wafer-level package device, such as the device shown in FIG. 4, in accordance with the process shown in FIG. 5.

FIG. 5 illustrates an example process 200 that employs wafer-level packaging techniques to fabricate semiconductor devices, such as the devices 100 shown in FIGS. 1 through 4. FIGS. 6 through 11 illustrate sections of example semiconductor wafers that are utilized to fabricate semiconductor devices 300 (such as device 100 shown in FIG. 4). In FIG. 6, the device 300 is illustrated prior to being segmented into integrated circuit devices. It is contemplated that the device 300 comprises a semiconductor wafer 302 that includes one or more integrated circuits (not shown) formed therein. Together, these integrated circuits form an integrated circuit chip 304 that comprises a substrate 306. As described above, the integrated circuits may be formed from suitable semiconductor formation techniques, such as deposition, etching, annealing, photolithography, and so forth. The integrated circuits may be comprised of digital circuit technology, analog circuit technology, mixed-signal technology, and so forth. The integrated circuits are connected to one or more conductive layers (e.g., contact pads, redistributions structures, etc.) that provide electrical contacts through which the integrated circuits are interconnected to other components associated with the device 300, such as printed circuit boards, or the like. For instance, as illustrated in FIG. 6, the device 300 includes one or more contact pads 308 positioned over one or more integrated circuits to provide electrical contact to the integrated circuits.

A dielectric layer is formed over a surface of a wafer (Block 202). For example, as shown in FIG. 6, a dielectric layer 310 (e.g., BCB material, polyimide (PI), polybenzoxazole (PBO), or the like) is formed over a surface 312 of the wafer 302. The dielectric layer 310 may be deposited via one or more suitable deposition techniques, such as physical vapor deposition, chemical vapor deposition, molecular beam epitaxy, and so forth.

Figure 7:
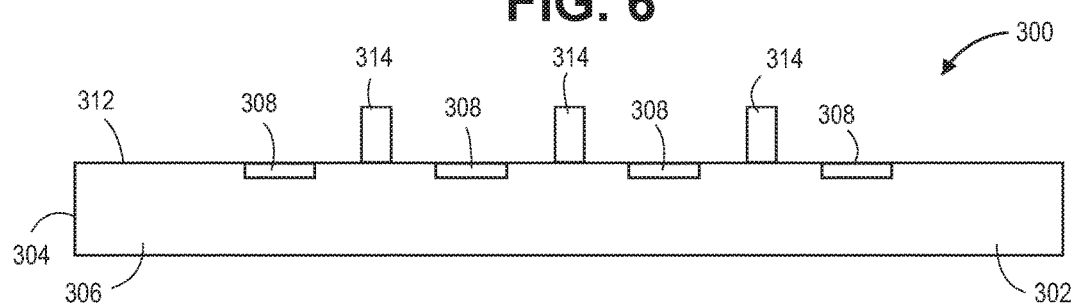
Figure 8:
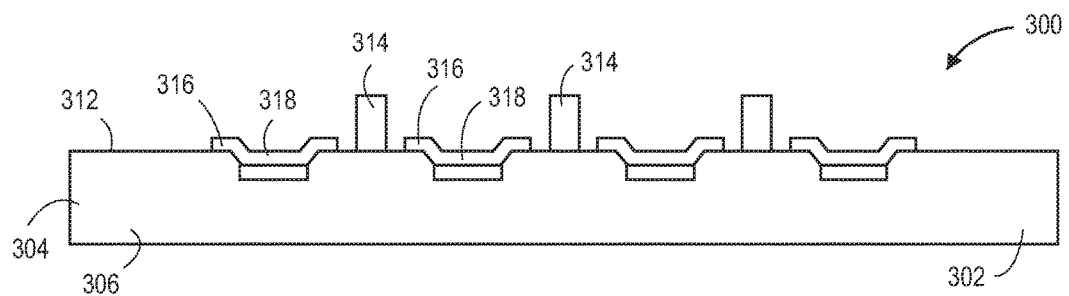

Dividers are then formed over the wafer (Block 204). In one or more implementations, the dividers 314 shown in FIG. 7 are formed by selectively etching the dielectric layer 310. For instance, a suitable photolithography technique may be utilized to selectively remove undesired dielectric layer 310 portions to form the dividers 314. It is contemplated that the photolithography techniques may employ dry etching, wet etching, or the like, to provide an anisotropic etch to form the dividers 314. It is also contemplated that laser processing can be utilized to form the dividers 314. It is contemplated that the amount of dielectric layer 310 deposited over the surface 312 may be a function of the desired divider 314 height.

Once the dividers have been formed, bump interfaces are applied to the contact pads of the integrated circuit chip (Block 206). In one or more implementations, the bump interfaces (e.g., bump interfaces 316 shown in FIG. 8)

comprise a UBM structure 318 applied to the contact pads 308 of the device 300. The UBM 318 may have a variety of compositions. For example, the UBM 318 may include multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other UBM structures are possible.

Figure 9:
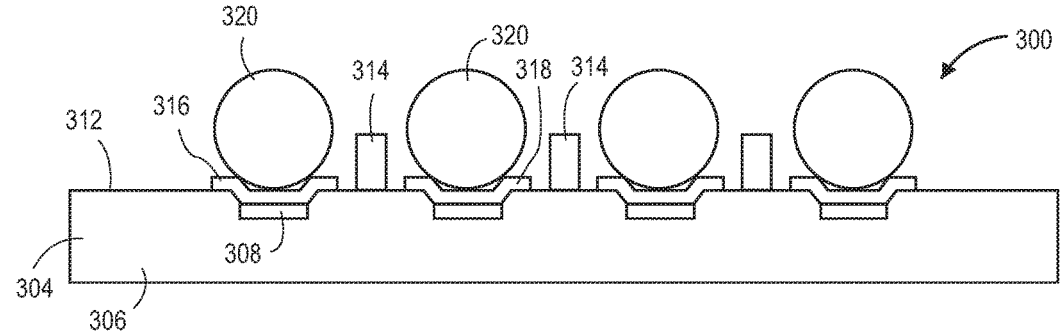
Figure 10:
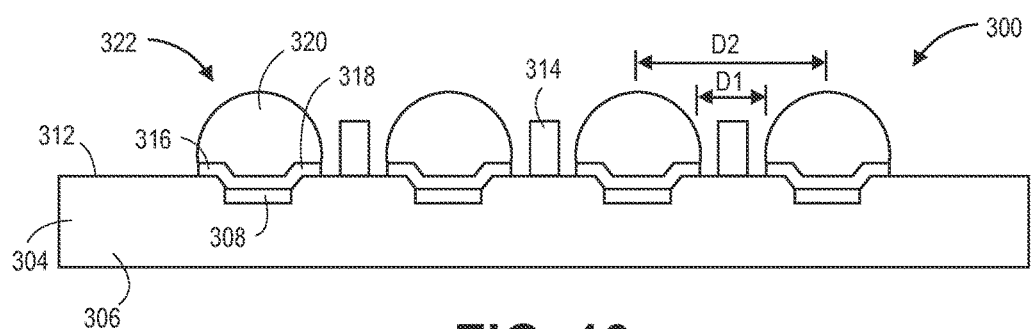
Figure 11:
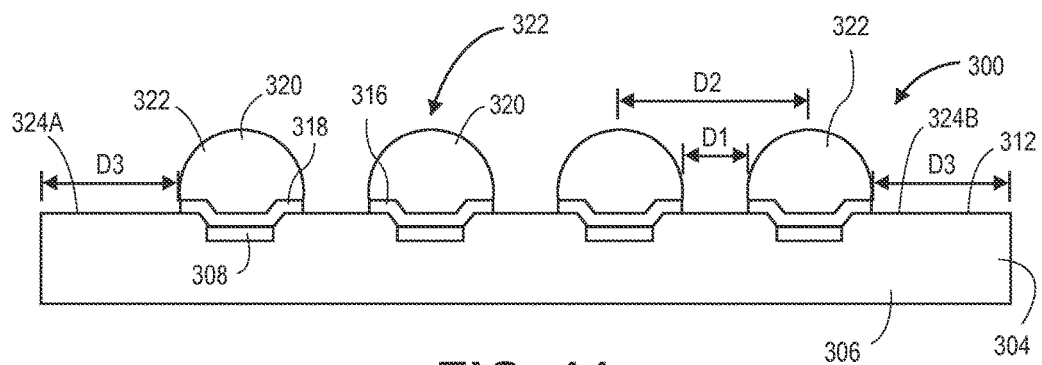

One or more attachment bumps (e.g., solder bumps) are positioned over one or more bump interfaces (Block 208). For instance, the attachment bumps may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. As shown in FIG. 9, the attachment bumps 320 are positioned over bump interfaces 316, such as UBM 318, that are applied to contact pads 308 of the integrated circuit chip 304. In an implementation, the attachment bumps 320 may include the cores (e.g., cores 116) as described above and shown in FIG. 2. In another implementation, the attachment bumps 320 may be formed about post structures (e.g., post structures 118) as described above and shown in FIG. 3.

The attachment bumps are then reflowed to the bump interfaces to form bump assemblies (Block 210). During reflow, the wafer 302 is subjected to a controlled heat (e.g., via a solder reflow oven), which melts the attachment bumps 320, securing the solder to the corresponding bump interfaces 318 (see FIG. 9) and forming the bump assemblies 322. As described above, the dividers 314 serve to prevent migration of solder to neighboring sites (e.g., adjacent attachment bumps 320, etc.) that may result in shorting of the device 300. Thus, the dividers 314 may allow for a device 300 to be fabricated where the smallest distance (D1) between two adjacent attachment bumps 320 may be smaller than about twenty-five percent (25%) of the pitch distance between the two adjacent attachment bumps 320. For instance, a pitch of 0.35 mm between two adjacent attachment bumps 320 equates to a smallest distance value of about 0.0875 mm between the two adjacent attachment bumps. Moreover, the dividers 314 may allow for a pitch reduction that increase the number of attachment bumps 320 per area without reducing the size of the bumps 320. Typically, solder bumps having a pre-reflow diameter of two hundred and fifty (250) microns have a pitch of 0.4 mm. However, the devices 300 may have a pitch of about 0.35 mm while still having solder bumps (e.g., attachment bumps 320) having a pre-reflow diameter of two hundred and fifty (250) microns. It is contemplated that solder bumps having pre-reflow diameters greater than and less than two hundred and fifty (250) microns may be utilized depending on the design requirements and characteristics of WLP device 300. Moreover, the pitch (D2) of device 300 may also vary with respect to the pre-reflow diameter of the attachment bumps 320 and thus, the pitch (D2) of each device 300 may be adjusted accordingly as a function of the pre-reflow diameter of the bumps 320.

After the reflow process, the dividers may be removed from the wafer (Block 212). In one or more implementations, the devices 300 may be subjected to an etching procedure to remove the dividers 314. For example, one or more suitable etching techniques may be utilized to remove the dividers 314 from the wafer 302. However, it is also contemplated that in one or more other implementations that the dividers 314 may be retained on the devices 300 through subsequent wafer-level packaging steps to provide further mechanical support to the device 300. As described above, the attachment bump 320 height may be greater than the divider 314 height so that the attachment balls may interconnect with corresponding printed circuit board pads (not shown).

Once the wafer fabrication process is complete, suitable wafer-level packaging processes may be employed to segment and package the individual semiconductor devices (Block 214) into at least one wafer-level package semiconductor device. In one or more implementations, the segmented semiconductor devices (e.g., devices 300) may comprise wafer chip-scale package devices. Moreover, once fabricated, the devices 300 may include one or more overhang portions 324A, 324B that extend beyond the outermost bump assemblies 322. As described with respect to FIG. 1, the overhang portions 324A, 324B provide further mechanical support and solder reliability to the WLP device 300. In one or more implementations, the distance (D3) of the overhang portions 324A, 324B is greater than the pitch (D2). For instance, the distance of overhang portion 324A is greater than the pitch (D2) between two adjacent attachment bumps 316. However, it is contemplated that in other implementations the distance of the overhang portions 324A, 324B may be less than the pitch (D2).

While FIGS. 6 through 11 illustrate a device 300 employing a BOP configuration, it is further contemplated that the device 300 may employ a RDL configuration. An RDL configuration includes a redistribution structure comprised of a thin-film metal (e.g., aluminum, copper) rerouting and interconnection system that redistributes the contact pads (e.g., contact pads 308) to an area array of bump interfaces (e.g., UBM pads) that may be more evenly deployed over the WLP device.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising: an integrated circuit chip; and a plurality of reflowed attachment bumps disposed on the integrated circuit chip, wherein a smallest distance between two adjacent reflowed attachment bumps of the plurality of reflowed attachment bumps is smaller than twenty-five percent of a pitch between the two adjacent reflowed attachment bumps, wherein each attachment bump of the plurality of attachment bumps is formed about a post structure.

* * * * *